(12) United States Patent
Wu et al.

(10) Patent No.: US 8,319,121 B2
(45) Date of Patent: Nov. 27, 2012

(54) SERVER ENCLOSURE

(75) Inventors: Hung-Yi Wu, Taipei Hsien (TW); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 196 days.

(21) Appl. No.: 12/882,222

(22) Filed: Sep. 15, 2010

(65) Prior Publication Data
US 2012/0043868 A1 Feb. 23, 2012

(51) Int. Cl.
*H05K 7/14* (2006.01)
*A47B 81/00* (2006.01)
*A47H 1/10* (2006.01)
*H05K 5/00* (2006.01)

(52) U.S. Cl. ............... 174/535; 361/724; 361/679.02; 361/752; 312/223.2; 312/265.5; 174/50; 174/562; 248/300

(58) Field of Classification Search .......... 174/50, 174/520, 535, 562; 361/724, 600, 679.02; 361/679.01, 673, 730
See application file for complete search history.

(56) References Cited

U.S. PATENT DOCUMENTS

| | | | |
|---|---|---|---|
| 6,549,398 B2 * | 4/2003 | Chen | 361/679.58 |
| 6,657,868 B1 * | 12/2003 | Hsue | 361/728 |
| 7,345,237 B2 * | 3/2008 | Chen et al. | 174/50 |
| 2004/0264122 A1 * | 12/2004 | Green et al. | 361/685 |
| 2006/0250757 A1 * | 11/2006 | Ezaki | 361/600 |
| 2010/0165556 A1 * | 7/2010 | Sonehara et al. | 361/679.01 |
| 2010/0259879 A1 * | 10/2010 | Watanabe | 361/679.08 |

* cited by examiner

*Primary Examiner* — Zachary M Pape
*Assistant Examiner* — Binh Tran
(74) *Attorney, Agent, or Firm* — Altis Law Group, Inc.

(57) ABSTRACT

A server enclosure includes a bottom wall, two sidewalls extending from opposite sides of the bottom wall, a backboard to electrically connected to a number of hard disk drives, and two fixing elements. The fixing elements are fixed on opposite ends of the backboard. Each fixing element includes a connection board fixed on the backboard, a first fixing portion extending from a bottom of the connection board along a first direction, and a positioning arm extending from a side of the connection board along the first direction. The first fixing portion is fixed on the bottom wall. The positioning arm is slidably positioned on the corresponding sidewall to fix the backboard.

9 Claims, 6 Drawing Sheets

SERVER ENCLOSURE

BACKGROUND

1. Technical Field

The present disclosure relates to a server enclosure.

2. Description of Related Art

Generally, a server enclosure receives hard disk drives (HDDs) and a backboard connected to the HDDs. The backboard is fixed in the server enclosure by screws extending through some through holes of the backboard and engaging in some screw holes of the server enclosure. To accomplish this, the backboard must first be positioned accurately to align all the screw holes, which is time-consuming and inconvenient.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
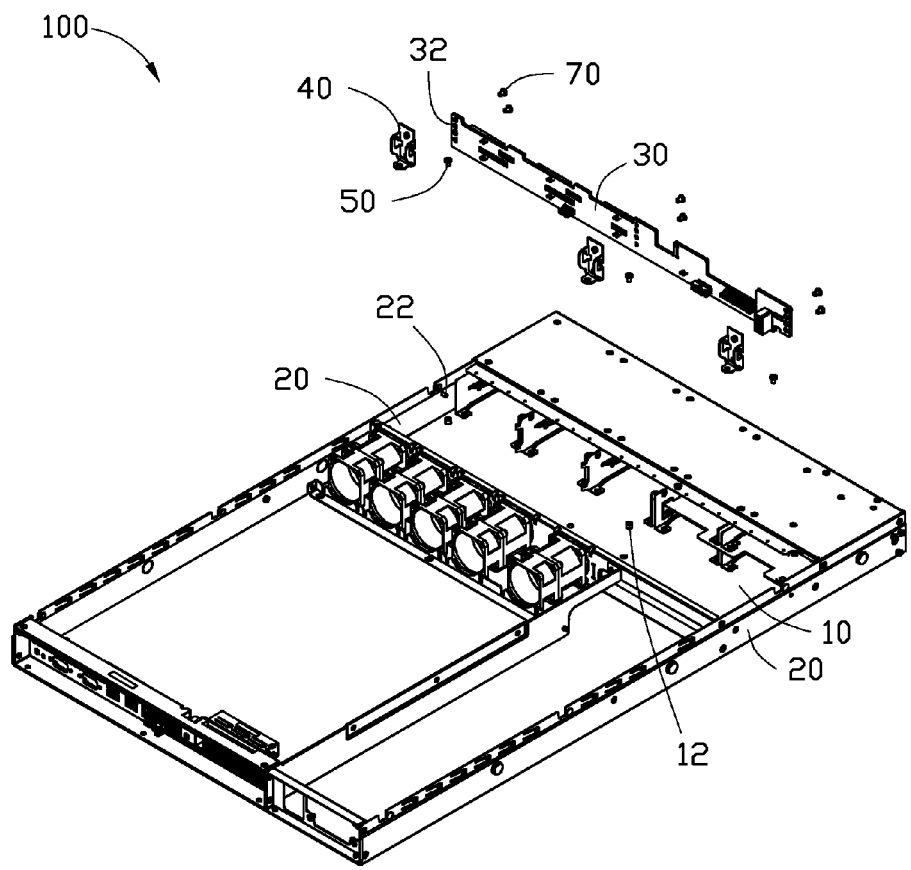
FIG. 1 is an exploded, isometric view of an exemplary embodiment of a server enclosure; the server enclosure includes a fixing element.
Figure 2:
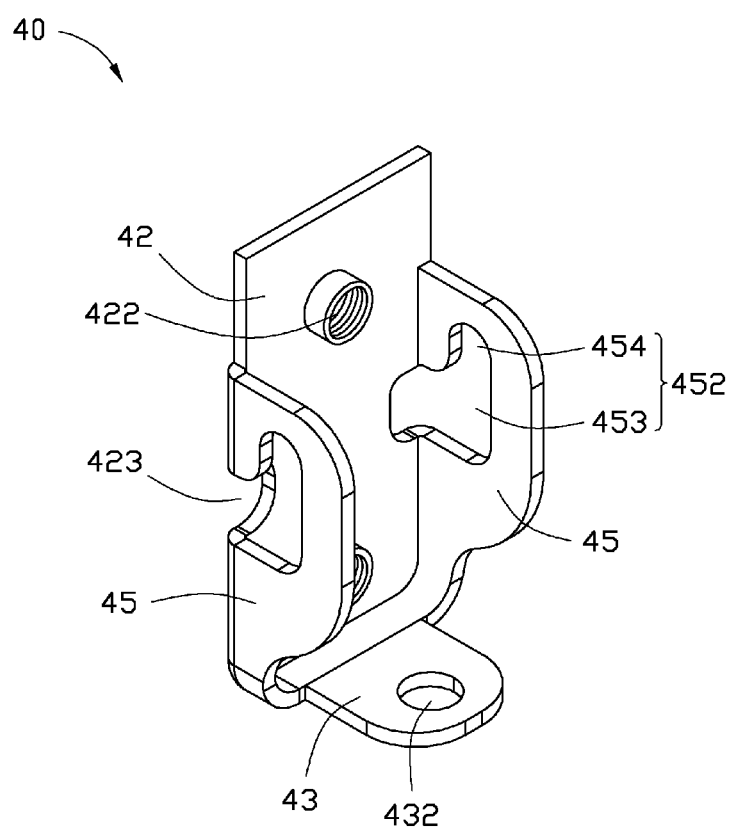
FIG. 2 is an enlarged, isometric view of the fixing element of FIG. 1, but viewed from another perspective.

Referring to FIGS. 1 and 2, an exemplary embodiment of a server enclosure 100 includes a bottom wall 10, two sidewalls 20 perpendicularly extending up from two opposite sides of the bottom wall 10, a backboard 30, and three fixing elements 40.

The backboard 30 is used to electrically connect to a plurality of hard disk drives (not shown) accommodated in the server enclosure 100. Two through holes 32 are defined in each of two opposite ends and a middle of the backboard 30.

The fixing elements 40 are used to fix the backboard 30 in the server enclosure 100. Each fixing element 40 includes a connection board 42, a first fixing portion 43 perpendicularly extending forward from a bottom end of the connection board 42, and two fixing arms 45 perpendicularly extending forward from two sides of the connection board 42. Two threaded screw holes 422 are defined in the connection board 42. Two cutouts 423 are defined in two opposite sides of the connection board 42. Two substantially L-shaped slide slots 452 are defined in the fixing arms 45, respectively. Each slide slot 452 includes an access portion 453 communicating with the corresponding cutout 423, and a positioning portion 454 communicating with and substantially perpendicular to the access portion 453. A hole 432 is defined in the first fixing portion 43 of each fixing element 40.

Three posts 12, arranged in a line, protrude up from the bottom wall 10 of the server enclosure 100. Each post 12 is hollow and internally threaded. Two positioning posts 22 protrude from the sidewalls 20 adjacent to the corresponding posts 12, respectively, to position the fixing elements 40.

Figure 3:
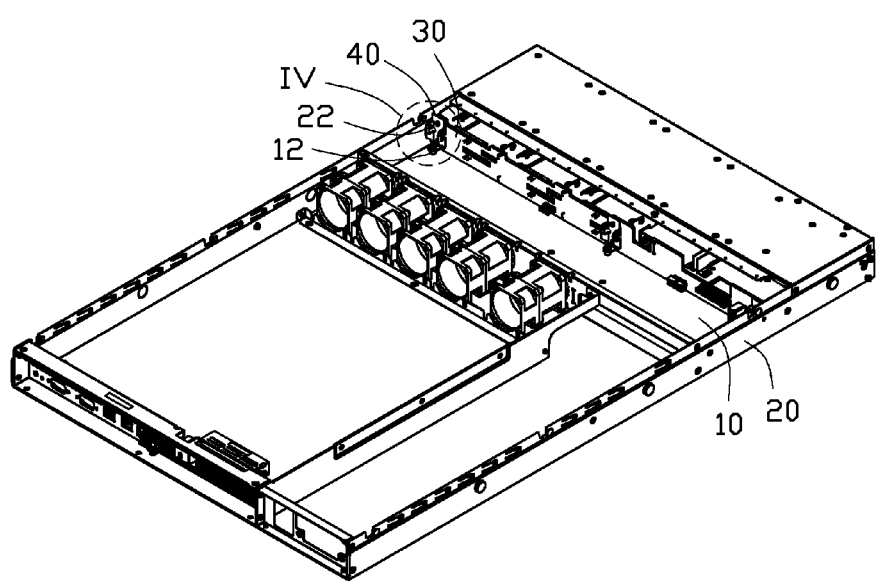
FIG. 3 is an assembled, isometric view of the server enclosure of FIG. 1.
Figure 4:
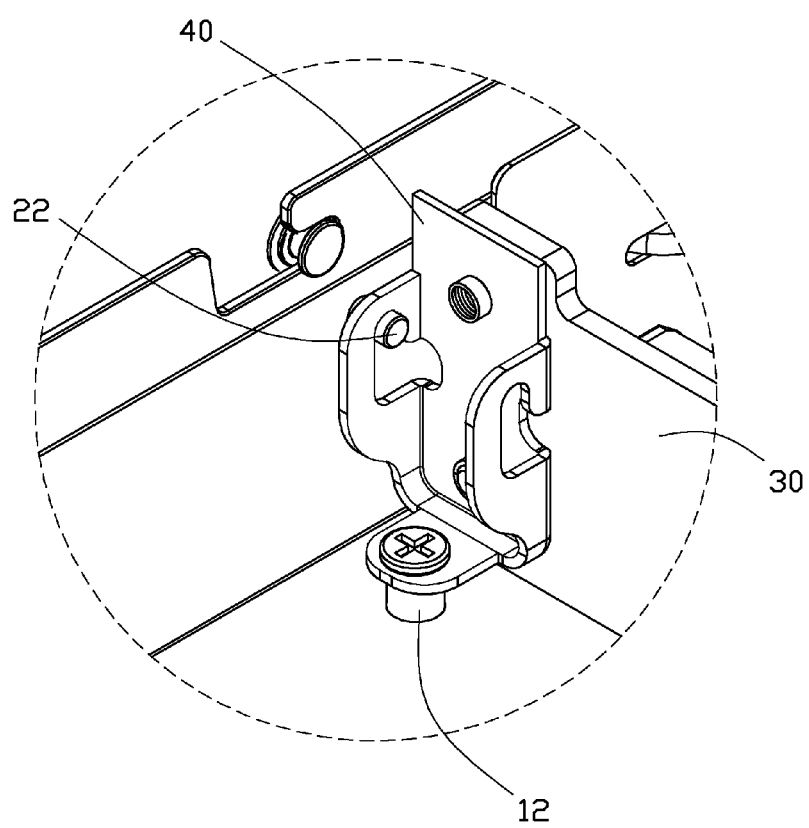
FIG. 4 is an enlarged view of a circled portion IV of FIG. 3.

Referring to FIGS. 3 and 4, in assembling the fixing elements 40 to the backboard 30, the screw holes 422 of the fixing elements 40 align with the through holes 32 of the backboard 30. The fixing elements 40 are fixed to the backboard 30 by screws 70 extending through the through holes 32 of the backboard 30 and engaging in the screw holes 422 of the fixing elements 40.

In assembling the backboard 30 with the fixing elements 40, the positioning posts 22 of the two sidewalls 20 extend through the cutout 423 of the corresponding fixing elements 40 located two sides of the bottom wall 10. The backboard 30 is moved down, with the positioning posts 22 sliding from the corresponding cutouts 423 to the corresponding positioning portion 454 through the corresponding access portion 453. The positioning posts 22 are positioned in the positioning portions 454, to position the backboard 30 in the server enclosure 100. The holes 432 of the fixing elements 40 align with the screw posts 12, and three screws 50 are extended through the holes 432 and screwed into the screw posts 12. Thereby, the backboard 30 is fixed to the server enclosure 100.

To disengage the backboard 30 from the server enclosure 100, the screws 50 are released from the corresponding posts 12. The backboard 30 is moved up, thereby the positioning posts 22 are slid from the corresponding positioning portion 454 to the corresponding cutout 423 through the access portion 453.

Figure 5:
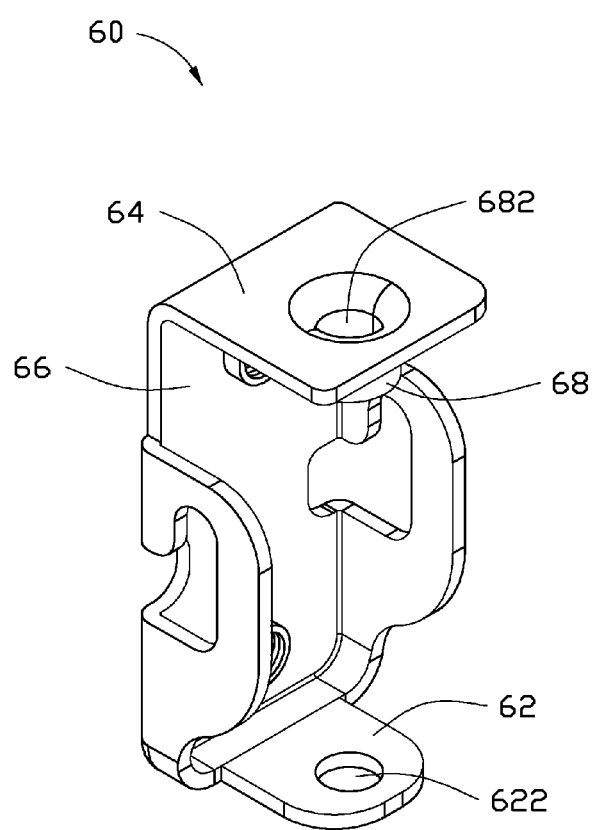
FIG. 5 is an enlarged view of a second exemplary embodiment of the fixing element of FIG. 1.
Figure 6:
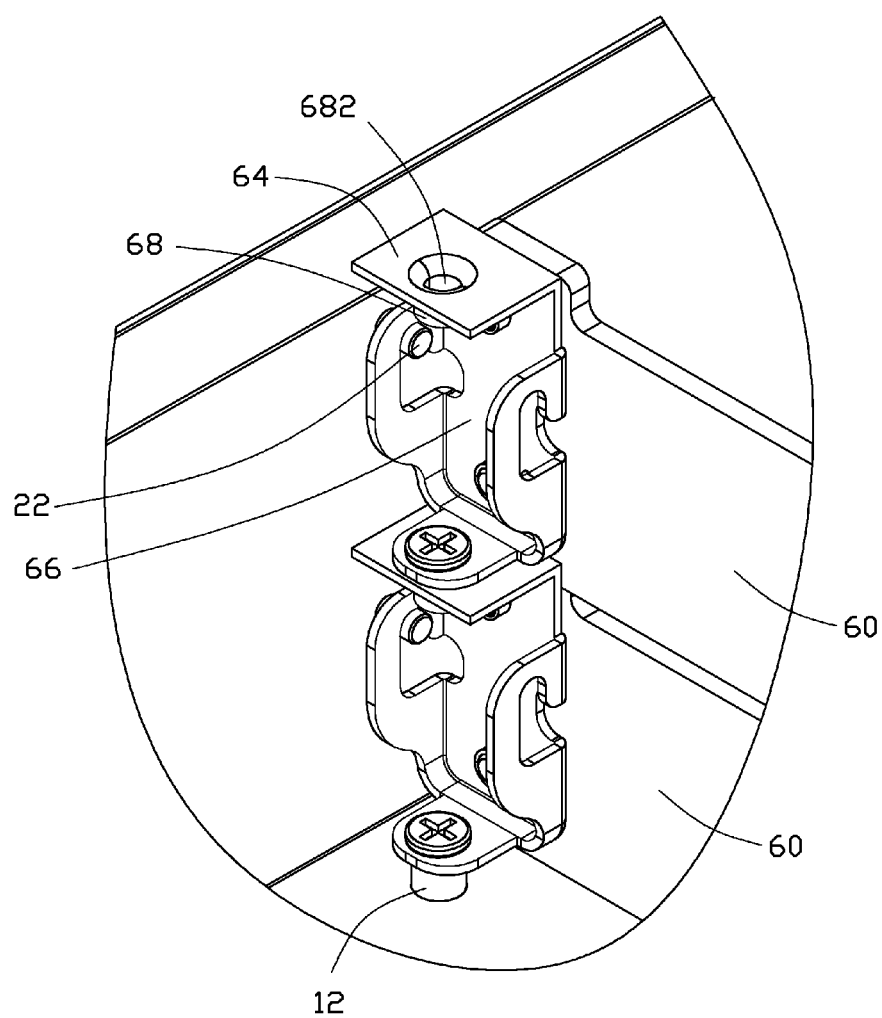
FIG. 6 is a view showing the fixing element of FIG. 5 used for fixing another server enclosure.

In the embodiment, the server enclosure 100 is a 1 unit (U) blade server enclosure. Referring to FIGS. 5 and 6, a second embodiment of a fixing element 60 is similar to the first embodiment of the fixing element 40. In the second embodiment, the server enclosure is a 2 U blade server which has a twice-height as the 1 U blade server. The fixing element 60 further includes a second fixing portion 64 perpendicular extending forward from a top end of the connection board 66. A hollow internally threaded post 68 perpendicularly extends down from the second portion 64. In use, one backboard 60 is fixed on another backboard 60 by a screw extending through the hole 622 of a first fixing portion 62 and being screwed into the post 68.

In other embodiments, the number of the fixing elements 40 and 60, and the screw posts 12 of the bottom wall 10 can be changed according to need.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A server enclosure, comprising:
    a bottom wall;
    two sidewalls extending up from opposite sides of the bottom wall;
    a backboard perpendicularly located on the bottom wall and between the sidewalls; and
    at least two fixing elements fixed to opposite ends of the backboard, each fixing element comprising:

a connection board fixed to the backboard;
a first fixing portion extending from a bottom of the connection board along a first direction, and fixed on the bottom wall; and
a fixing arm extending from a side of the connection board along the first direction, and slidably positioned on the corresponding sidewall to fix the backboard.

2. The server enclosure of claim 1, wherein the first direction is perpendicular to the backboard.

3. The server enclosure of claim 1, wherein two positioning posts protrude from the sidewalls, at least two posts corresponding to the at least two fixing elements protrude up from the bottom wall, a slide slot is defined in the fixing arm to form a slide path to guide the corresponding positioning post to slide to a top of the slide slot, thereby to position the backboard.

4. The server enclosure of claim 3, wherein the slide slot is substantially L-shaped, and comprises an access portion and a positioning portion communicating with the access portion, the slide path guide the corresponding positioning post to slide from the access portion to the positioning portion, a path that the positioning post slides through the access portion is perpendicular to a path that the positioning post slide through the positioning portion.

5. The server enclosure of claim 4, wherein a cutout corresponding to the fixing arm is defined in the side of connection board and communicates with the access portion, the slide path guide the corresponding positioning post to slide from the cutout to the positioning portion through the access portion.

6. The server enclosure of claim 1, wherein a hole is defined in the first fixing portion, a screw extends through the hole to engage with a corresponding post of the bottom wall.

7. The server enclosure of claim 1, wherein a plurality of through holes is defined in the backboard, a plurality of screw holes is defined in the connection board of each fixing element, a plurality of screws extends through the corresponding through holes of the backboard to engage in the corresponding screw holes of the connection board.

8. A server enclosure, comprising:
a bottom wall;
two sidewalls extending up from opposite sides of the bottom wall;
a backboard perpendicularly located on the bottom wall and between the sidewalls; and
a first fixing member comprising a first connection board fixed to a lower portion of the backboard, a first fixing portion substantially perpendicularly extending from a bottom of the first connection board and fixed to the bottom wall, and a second fixing portion substantially perpendicularly extending from a top of the first connection board; and
a second fixing member comprising a second connection board fixed to an upper portion of the backboard, a third fixing portion substantially perpendicularly extending from a bottom of the second connection board, wherein the third fixing portion is supported on the second fixing portion of the first fixing member;
wherein one of the first and second fixing member comprises a fixing arm extending from a side of the corresponding connection board, and slidably positioned on the corresponding sidewall to fix the backboard.

9. The server enclosure of claim 8, wherein a hollow internally threaded post extends down from the second fixing portion, a screw extends through the third fixing portion to engage with the connection post.

* * * * *